(12) United States Patent
Casse et al.

(10) Patent No.: US 9,077,164 B2
(45) Date of Patent: Jul. 7, 2015

(54) CUTTING PLATE FOR JOINING TOGETHER WIRING HARNESSES OF ELECTRICAL CABLES ON AN AIRCRAFT

(71) Applicant: Airbus Operations S.A.S., Toulouse (FR)

(72) Inventors: Christophe Casse, Fenouillet (FR); Steve Fernandez, Villeneuve-Tolosane (FR); Marie Bayle, Pechabou (FR)

(73) Assignee: Airbus Operations S.A.S. (FR)

( * ) Notice: Subject to any disclaimer, the term of this patent is extended or adjusted under 35 U.S.C. 154(b) by 52 days.

(21) Appl. No.: 14/084,950

(22) Filed: Nov. 20, 2013

(65) Prior Publication Data

US 2014/0141644 A1    May 22, 2014

(30) Foreign Application Priority Data

Nov. 22, 2012    (FR) ...................................... 12 61141

(51) Int. Cl.
*H02G 3/02* (2006.01)
*B60R 16/02* (2006.01)
*H05K 7/14* (2006.01)

(52) U.S. Cl.
CPC .............. *H02G 3/02* (2013.01); *B60R 16/0207* (2013.01); *H05K 7/1412* (2013.01)

(58) Field of Classification Search
CPC ......... H02G 3/00; H02G 3/02; H05K 7/1412; B60R 16/0207
USPC ........ 439/527, 533, 540.1, 542; 248/49, 68.1, 248/70; 174/541, 135, 72 A; 361/826, 361/679.01, 807, 809, 810; 29/592.1, 428; 307/9.1
See application file for complete search history.

(56) References Cited

U.S. PATENT DOCUMENTS

| | | | |
|---|---|---|---|
| 5,575,665 A * | 11/1996 | Shramawick et al. | .......... 439/49 |
| 6,170,784 B1 * | 1/2001 | MacDonald et al. | ........... 248/65 |
| 6,396,992 B1 * | 5/2002 | Debal | ........... 385/135 |
| 7,352,947 B2 * | 4/2008 | Phung et al. | .................. 385/135 |
| 7,404,736 B2 * | 7/2008 | Herbst et al. | .................. 439/557 |
| 2011/0249399 A1 | 10/2011 | Salles | |

FOREIGN PATENT DOCUMENTS

| | | |
|---|---|---|
| DE | 738 411 C | 8/1943 |
| EP | 2 378 849 A1 | 10/2011 |
| FR | 2 822 130 A1 | 9/2002 |

\* cited by examiner

*Primary Examiner* — Angel R Estrada
*Assistant Examiner* — Dimary Lopez Cruz
(74) *Attorney, Agent, or Firm* — Lerner, David, Littenberg, Krumholz & Mentlik, LLP

(57) ABSTRACT

A cutting plate includes a planar interface able to accept electrical connectors, two ramps for supporting harnesses and two lateral walls, the dimensions of the interface and of the two ramps in a longitudinal direction being adapted to suit the number of connectors of the cutting plate and the dimensions in the directions other than the longitudinal direction and the dimensions of the lateral walls conforming to standard dimensions.

15 Claims, 1 Drawing Sheet

CUTTING PLATE FOR JOINING TOGETHER WIRING HARNESSES OF ELECTRICAL CABLES ON AN AIRCRAFT

FIELD OF THE INVENTION

The present invention relates to a cutting plate for an aircraft.

BACKGROUND OF THE INVENTION

In the context of the present invention, a "cutting plate" means a plate (or structure) for holding electrical cut-off connectors, which is intended to be mounted on an aircraft and to accept electrical connectors, preferably conventional EN3545-type connectors. Cutting plates allow these electrical connectors to be used to join together electrical cables of at least two wiring harnesses (or bundles) of such cables, which respectively access the two sides of the cutting plate, so as to make an electrical connection between the electrical cables. A cutting plate may have a different number of such electrical connectors, potentially ranging from 1 to 18 or more connectors, notably according to the size and/or number of harnesses to be joined together.

In general, such a cutting plate is made of metal and notably usually comprises:
a planar interface able to accept the electrical connectors;
an environmental seal which protects against drips of liquid from the environment and in some instances has a fixing function;
two ramps which are arranged on either side of the interface and are intended to act as supports for the said harnesses; and
fixing elements, for example produced in the form of lateral walls or of a base element, which allow the cutting plate to be fixed to the interior of the aircraft, generally to the fuselage.

Now, for one and the same aircraft, there are a high number of different cutting plates. These plates notably differ in terms of their size and shape, in terms of the relative arrangement of their constituent parts (interfaces, ramps, etc.) and in terms of the size and shape of these constituent parts. There is thus a very wide variety of cutting plates available even for accepting the same number of connectors. Thus, for certain given numbers of connectors there are several tens of different plates available.

This wide diversity of cutting plates leads to a lack of standardization throughout the fuselage of the aircraft where such plates are used.

This high number of models, of different sizes and shapes, leads to disadvantages notably in terms of manufacture, installation, maintenance and cost.

BRIEF SUMMARY OF THE INVENTION

The present invention relates to a cutting plate for joining together at least two wiring harnesses of electrical cables of an aircraft, which notably allows the abovementioned disadvantages to be overcome.

To this end, according to an embodiment of the invention, the cutting plate comprising at least:
a planar interface able to accept electrical connectors intended to connect together electrical cables of the harnesses in order to make electrical connections, the interface being defined in a plane that has a first direction referred to as longitudinal and a second direction referred to as vertical which is orthogonal to the first direction, the vertical direction corresponding to the direction in which electrical connectors can be fixed to the interface, which electrical connectors are set out parallel to one another in succession in the longitudinal direction;
two ramps which are arranged one on either side of the interface, parallel to the longitudinal direction, and which are intended to act as supports for the harnesses; and
two lateral walls which are provided at the ends of the interface with respect to the longitudinal direction; as well as
fixing-aid elements,
is notable in that:
the dimensions of the interface and of the two ramps in the longitudinal direction are adapted to suit the number of connectors that the cutting plate is to be able to accept;
the dimensions of the interface and of the plates in the directions other than the longitudinal direction and the dimensions of the lateral walls of the cutting plate conform to standard dimensions; and
the fixing-aid elements are provided on at least two different faces of the cutting plate.

In the context of the present invention, standard dimensions means uniform dimensions, as specified hereinafter, which are used for all sizes of plate, i.e. which are independent of the number of connectors that a plate may accept, this generally ranging from one to eighteen.

Thus, by virtue of the invention, the cutting plates that can be used on an aircraft can be standardized, the plates according to embodiments of the invention all having the same characteristics accept for the length which varies according to the number of connectors to be provided for.

As a result, the cutting plate standard defined by the invention can be used for almost all of the connections in the wiring harness of an aircraft and thus effectively replace the wide variety of different plates usually employed. This allows the abovementioned disadvantages to be overcome.

The modularity of the plate is increased by the fact that it comprises fixing-aid elements, i.e. elements via which the plate is fixed to the fuselage, notably holes, on at least two different faces, and preferably on three different faces, thus increasing the number of possible ways in which the plate can be fixed and in making the plate more adaptable to the configuration of the location within the fuselage at which it is to be arranged.

For preference, the cutting plate comprises fixing-aid elements on a protective panel and on at least one of the said lateral walls.

In one preferred embodiment, the cutting plate comprises a protective panel which is arranged above the interface in the vertical direction, substantially orthogonal thereto, and which is intended to protect the interface and the electrical connectors from any liquid which may drip inside the fuselage of the aircraft. For that purpose, the protective panel advantageously comprises fixing-aid elements corresponding to fixing holes, which are rendered impermeable to any liquid.

For the same reason, in one particular embodiment, for which the lateral walls have a position that is inclined with respect to the vertical direction when the cutting plate is installed in the aircraft, the lateral wall arranged vertically highest up is solid (free of holes).

Moreover, in one preferred embodiment, the cutting plate is made of composite material, making it possible to reduce the mass of the plate, by comparison with the usual plates which are made of metal. In addition, as specified hereinbelow, the cutting plate features according to an embodiment of the invention are particularly well suited to manufacture from composite material, and in particular a composite material containing long fibres which is highly advantageous in use on an aircraft.

Moreover, advantageously, at least one ramp, but preferably both ramps:

are arranged more than a predetermined minimum distance away from the interface so as to allow electrical cables to curve downward between the ramp and the interface, in order to generate a dripping effect; and/or are provided with positioning zones at least on the upper face; and/or have a semicircular cross section.

The present invention also relates to a method of manufacturing a cutting plate comprising the aforementioned elements for joining together at least two wiring harnesses of electrical cables.

This method is noteworthy in that:

the dimensions of the interface and of the two ramps in the longitudinal direction are adapted to suit the number of connectors that the cutting plate is to be able to accept;

the dimensions of the interface and of the ramps in the directions other than the longitudinal direction, and the dimensions of the lateral walls are made to conform to standard dimensions, i.e. dimensions that are uniform and independent of the number of connectors that the plate is to be able to accept; and the fixing-aid elements are provided on at least two different faces of the cutting plate.

Furthermore, advantageously, the cutting plate is manufactured from composite material.

The present invention also relates to an aircraft electrical installation comprising wiring harnesses of electrical cables and cutting plates which are provided with electrical connectors and allow at least two wiring harnesses of electrical cables to be connected together. According to an embodiment of the invention, this electrical installation comprises a plurality of cutting plates as described hereinabove, which have different dimensions (lengths) in the longitudinal direction and the same dimensions and shapes in the other directions. Thus, this electrical installation can be produced with a lower mass, a shorter assembly time and at a lower cost.

Moreover, the present invention also relates to an aircraft, particularly a transport airplane, which comprises at least one cutting plate and/or at least one electrical installation as aforementioned.

BRIEF DESCRIPTION OF THE DRAWINGS

The figures of the attached drawing will make it easy to understand how the invention may be achieved. In these figures, identical references are used to denote similar elements.

DETAILED DESCRIPTION

Figure 1:
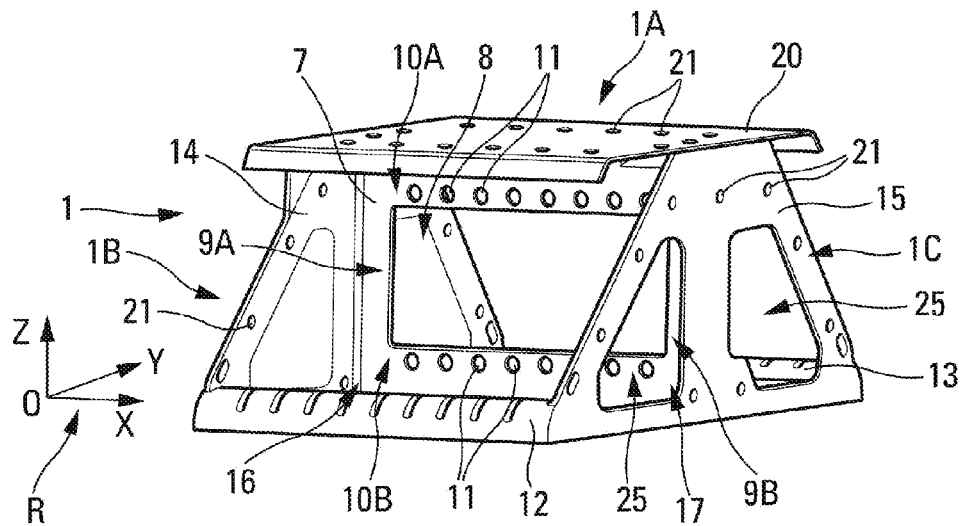
FIG. 1 is a perspective view of a cutting plate according to one preferred embodiment of the invention.

The cutting plate 1 according to an embodiment of the invention and depicted in FIG. 1 is intended to be mounted on an aircraft (not depicted), particularly a transport airplane.

Figure 2:
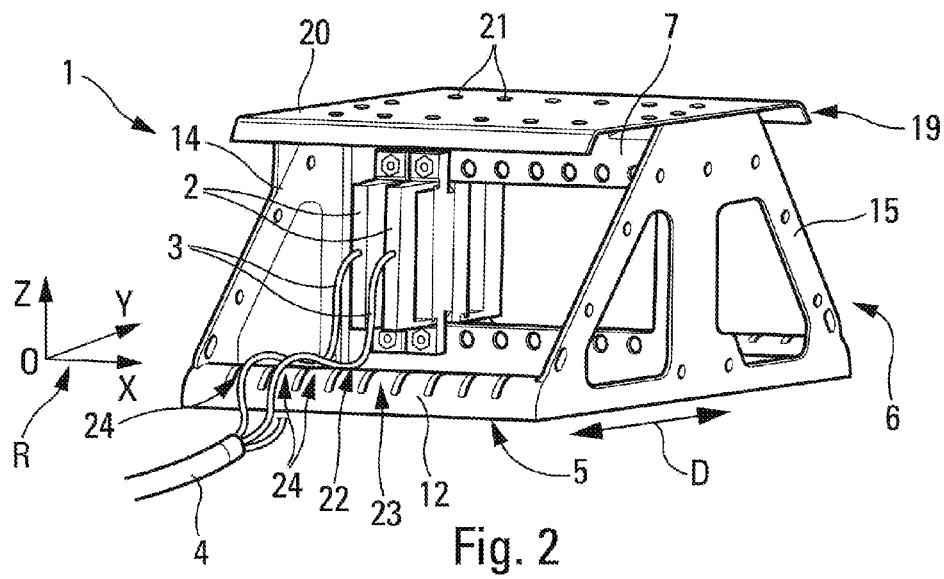
FIG. 2 is a perspective view of a cutting plate provided with electrical connectors and with electrical cables which have been depicted schematically and partially.

In the usual way, this cutting plate 1 is intended to accept electrical connectors 2, as depicted schematically in FIG. 2, preferably electrical connectors that meet the EN3545 standard for the purposes of joining together electrical cables 3 of at least two wiring harnesses 4 (or bundles) of such cables, just one of which has been depicted in FIG. 2, these harnesses 4 respectively accessing two sides 5 and 6 of the cutting plate 1, so as to make an electrical connection between the electrical cables joined together. To simplify the drawing, just one cable 3 per connector has been depicted in FIG. 2 even though in general each connector 2 connects together a first wiring bundle of several cables (coming from side 5) with a second wiring bundle of several cables (coming from side 6). In the usual way, a main wiring harness 4 may contain a high number of cables 3 which are distributed as several bundles and each of these bundles of (several) cables is connected to a connector 2. Depending on the situation, there may be one single main harness per side or several main harnesses per side (relating notably to different systems of the aircraft).

Depending notably on the size and/or number of harnesses to be joined together, a cutting plate 1 may comprise a variable number of electrical connectors 2, potentially ranging from one to eighteen (or more).

In general, this plate 1 comprises at least, as depicted in FIG. 1:

a planar interface 7 which is able to accept the electrical connectors 2 (which are intended to electrically connect together electrical cables of the harnesses 4). This interface 7 is defined in a plane that has a first direction OX referred to as longitudinal and a second direction OZ referred to as vertical which is orthogonal to this longitudinal direction OX. The vertical direction OZ corresponds to the direction in which connectors 2 can be fixed to the interface 7, which connectors are arranged parallel to one another (along OZ), in succession in a direction corresponding to the longitudinal direction OX (FIG. 2). A frame of reference R (for the structural definition of the plate 1 in the remainder of the description) comprises, in addition to the directions OX and OZ, a direction referred to as lateral OY which is orthogonal to the said directions OX and OZ. The interface 7 has the shape of a rectangular frame provided with a central rectangular opening 8 and with vertical lateral edges 9A and 9B and longitudinal edges 10A and 10B. The longitudinal edges 10A and 10B are provided with holes 11 opposite one another in pairs in the vertical direction OZ, which are intended for fixing connectors 2 to the interface 7 using conventional fixing means;

two ramps 12 and 13 which are arranged on either side of the interface 7, parallel to the longitudinal direction OX and are intended to act as supports for the harnesses 4; and two lateral walls 14 and 15 which are provided at the ends 16 and 17 of the interface 7 with respect to the longitudinal direction OX and which are arranged in a vertical plane defined by the directions OY and OZ.

According to an embodiment of the invention:

the dimensions of the interface 7 and of the two ramps and 13 in the longitudinal direction OX, (namely the length thereof), are adapted to suit the number of connectors 2 that the cutting plate 1 is to be able to accept. By way of illustration, in the example of FIG. 1, each longitudinal edge 10A, 10B of the interface 7 comprises eight holes 11 which are spaced apart so as to be able to accept connectors 2 arranged side by side (as illustrated in FIG. 2), in this particular instance, eight connectors. Thus, if the plate 1 were to be capable of accepting a lower number of connectors, for example 2, 4, 6 connectors, its length (along OX) would be shorter. Conversely, if the plate were to be capable of accepting a higher number of connectors, for example ten, twelve, etc., its length (along OX) would be increased. The ramps 12 and 13 have the same length (along OX) as the interface 7;

the dimensions of the interface 7 and of the ramps 12 and 13 in the directions OY and OZ (other than the longitudinal OX), and the dimensions of the other elements (notably of the lateral walls 14 and 15) of the cutting plate 1 themselves conform to standard dimensions. In the context of the present invention, standard dimensions means uniform dimensions which are used by all sizes of plate 1, i.e. irrespective of the number of connectors that a plate 1 is to be able to accept.

Thus, because the plates 1 according to an embodiment of the invention have the same characteristics except for length which varies according to the number of connectors 2 to be provided, the cutting plates 1 that are likely to be used on an aircraft are standardized.

The standard cutting plate 1 obtained by virtue of the invention can be used for almost all of the wiring harness connections encountered on an aircraft and thus effectively replace the multitude of usual plates, thus affording advantages notably in terms of manufacture, installation, maintenance and cost.

In order to reduce the number of plates 1, it is possible to provide only plates for an even number N of connectors (N=2, 4, etc.) and to leave (on a plate designed for N connectors) one connector space unused if N−1 connectors are to be fixed in place.

The modularity of the plate 1 is increased by the fact that it comprises fixing-aid elements, notably holes 21, on at least two different faces of the plate 1 (and preferably on three different faces 1A, 1B and 1C), this increasing the number of fixing options and promoting the adaptability of the plate 1 to suit the configuration of the place in the fuselage where it is to be arranged. In the context of the present invention, fixing-aid elements means elements of the plate at which the plate can be fixed to the fuselage. These are preferably simple holes 21. However, it is possible to conceive of other elements, such as small supports which are secured to the plate or form part of the plate and via which this plate can be fixed in the aircraft.

A cutting plate 1 according to an embodiment of the invention can thus be fixed at any point in the fuselage, affording flexibility for integrating plates on the aircraft.

The cutting plates 1 according to an embodiment of the invention are intended to form part of an aircraft electrical installation which generally comprises a plurality of wiring harnesses of electrical cables and a plurality of such cutting plates provided with electrical connectors (which are intended to join together at least two wiring harnesses of electrical cables in each instance). Thus, by virtue of the invention, this electrical installation can be produced notably for a lower mass, a shorter assembly time and a lower cost.

The lateral walls 14 and 15 have a symmetrical trapezoidal shape with the widest base situated at the bottom (in relation to OZ). For weight reduction purposes in particular, at least one of these walls has cutouts forming openings 25, as depicted in the case of the wall 15.

In a preferred embodiment depicted in FIGS. 1 and 2, the cutting plate 1 additionally comprises a protective panel 20 which is arranged substantially horizontally in a plane defined by OX and OY, being fixed above the interface 7 (in relation to OZ) substantially perpendicular to the latter. This protective panel 20 preferably has standard dimensions in the lateral direction OY with bent-over edges 19 (FIG. 2) and a length (along OX) dependent of that of the interface 7, protruding beyond the latter slightly on the two sides. This protective panel is intended to protect the interface 7 and thus the electrical connectors 2 fixed thereto, from any liquid that could drip inside the fuselage of the aircraft. For that reason, this protective panel 20 preferably has fixing holes 21 which are rendered impermeable.

To achieve that, sealing elements are provided in the fixing holes 21 and are removed only from those holes that are used for fixing. These sealing elements may be any type of plug or deliberately weakened portion of the wall that can be removed easily to form a fixing hole 21 for using.

For preference, the cutting plate 1 comprises fixing-aid elements notably holes 21 on the protective panel (face 1A) and on at least one of the lateral walls 14 (face 1B) and 15 (face 1C).

Figure 3:
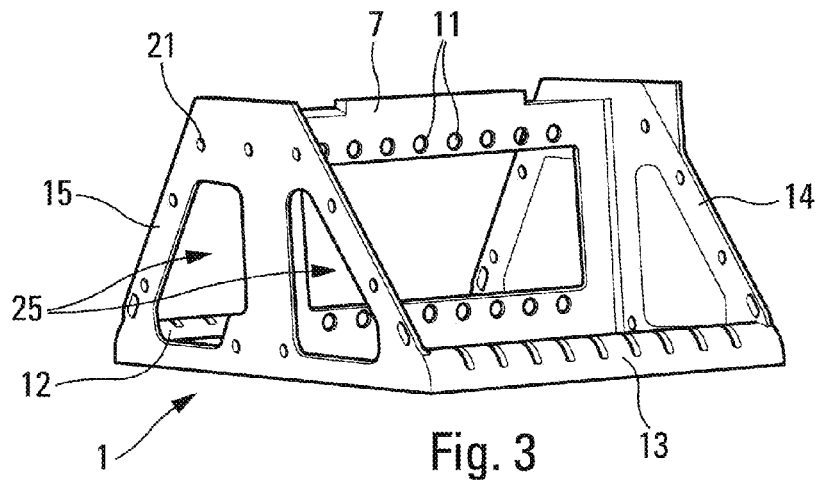
FIG. 3 is a perspective view of a cutting plate according to one particular embodiment of the invention.

The plate 1 may also have no protective panel 20, as is the case in the particular embodiment depicted in FIG. 3.

In one particular embodiment, for which the lateral walls 14 and 15 have a position that is inclined with respect to the vertical direction OZ when the plate 1 is fixed to the fuselage of the aircraft, the lateral wall arranged vertically upward is solid (i.e. free of open holes). Such is the case in the embodiments depicted in FIGS. 1 to 3 in the case of the lateral wall 14. This feature also serves to protect the connectors from any liquid that may drip inside the fuselage.

Moreover, in one preferred embodiment, the cutting plate 1 is made of composite material, making it possible to reduce the mass of the plate 1, by comparison with the conventional plates which are made of metal.

The features of the cutting plate 1, and notably of the ramps 12 and 13 as specified hereinbelow, are particularly well suited to manufacture from composite material, and in particular a composite material containing long fibres (with a thermosetting resin or a thermoplastic resin), which is highly advantageous in use on an aircraft.

Moreover, the two ramps 12 and 13 are arranged at a distance D from the interface 7 which is greater than a predetermined minimum distance so as to allow the electrical cables 3 to curve downwards between the ramp 12 and the interface 7 as depicted in FIG. 2 in order to generate a drip effect, i.e. to force water (or more generally liquid) to flow downward under the effect of gravity when it reaches the bottom of the curve 22, thus protecting the interface 7 and therefore the electrical connectors 2 from any liquid there might be on a harness 4 or a cable 3.

The two ramps 12 and 13 additionally have a semicircular cross section the rounded face 23 of which is arranged uppermost. Such a cross section is well suited to production in a composite material, unlike, for example, the conventional ramps which are tube shaped. In addition, this rounded shape prevents any damage to a harness that comes into contact with the ramp 12, 13, because the ramp 12, 13 thus has no salient edges.

The two ramps 12 and 13 are also provided with positioning zones 24, i.e. with zones delimited laterally, at least on the rounded upper face 23, making it easier to position the cables and improving their fixing to the ramp 12, 13 (which is generally performed using conventional clamps).

Furthermore, each ramp 12, 13 and the lateral walls 14 and 15 end at the same level in the lateral direction OY in order to avoid any damage to a harness that could occur if it were arranged along the ramp in the longitudinal direction OX.

In the context of the present invention, the cutting plate 1 may be produced as a single piece or may be produced in several pieces fixed together.

By virtue of the aforementioned features, the present invention notably permits:

standardized (at least partially standardized) manufacture, thus shortening manufacturing time and cost of manufacture;

reduction in installation time; and reduction in mass.

The invention claimed is:

1. A cutting plate for joining together at least two wiring harnesses of electrical cables, the cutting plate comprising:
a planar interface configured to accept electrical connectors intended to connect together electrical cables of the harnesses to make electrical connections, the interface being defined in a plane having a first direction referred to as longitudinal and a second direction referred to as vertical which is orthogonal to the first direction, the vertical direction corresponding to the direction in which electrical connectors can be fixed to the interface, which electrical connectors are set out parallel to one another in succession in the said longitudinal direction;
first and second ramps arranged one on either side of the interface, parallel to the longitudinal direction, and configured to act as supports for the harnesses; and
first and second lateral walls provided at the ends of the interface with respect to the longitudinal direction; and
fixing-aid elements,
wherein the dimensions of the interface and of the first and second ramps in the longitudinal direction are adapted to suit the number of connectors that the cutting plate is to be able to accept;
the dimensions of the interface and of the ramps in the directions other than the said longitudinal direction and the dimensions of the lateral walls of the cutting plate conform to standard dimensions; and
the fixing-aid elements are provided on at least two different faces of the cutting plate.

2. The cutting plate according to claim 1, further comprising a protective panel arranged above the interface in the vertical direction, substantially orthogonal thereto.

3. The cutting plate according to claim 2, further comprising fixing-aid elements on the protective panel and on at least one of the lateral walls.

4. The cutting plate according to claim 2, wherein the protective panel comprises fixing-aid elements corresponding to fixing holes, which are rendered impermeable.

5. The cutting plate according to claim 1, wherein at least one of the lateral walls is free of holes.

6. The cutting plate according to claim 1, wherein at least one of the ramps is arranged more than a predetermined minimum distance away from the interface so as to allow electrical cables to curve downward between the at least one ramp and the interface.

7. The cutting plate according to claim 1, wherein at least one of the ramps is provided with positioning zones at least on an upper face thereof.

8. The cutting plate according to claim 1, wherein at least one of the ramps has a semicircular cross section.

9. The cutting plate according to claim 1, wherein the cutting plate is made of a composite material.

10. A method of manufacturing a cutting plate for joining together at least two wiring harnesses of electrical cables, the cutting plate comprising at least:
a planar interface configured to accept electrical connectors intended to connect together electrical cables of the harnesses to make electrical connections, the interface being defined in a plane having a first direction referred to as longitudinal and a second direction referred to as vertical which is orthogonal to the first direction, the vertical direction corresponding to the direction in which electrical connectors can be fixed to the interface, which electrical connectors are set out parallel to one another in succession in the longitudinal direction;
first and second ramps arranged one on either side of the interface, parallel to the longitudinal direction, and configured to act as supports for the harnesses; and
first and second lateral walls provided at the ends of the interface with respect to the longitudinal direction; and
fixing-aid elements,
wherein the dimensions of the interface and of the first and second ramps in the longitudinal direction are adapted to suit the number of connectors that the cutting plate is to be able to accept;
the dimensions of the interface and of the ramps in the directions other than the longitudinal direction, and the dimensions of the lateral walls are made to conform to standard dimensions; and
the fixing-aid elements are provided on at least two different faces of the cutting plate.

11. The method according to claim 10, wherein the cutting plate is manufactured from a composite material.

12. The method according to claim 10, wherein the cutting plate is made as a single piece.

13. The method according to claim 10, wherein the cutting plate is made as several pieces fixed together.

14. An aircraft electrical installation comprising wiring harnesses of electrical cables and cutting plates which are provided with electrical connectors and allow at least two wiring harnesses of electrical cables to be connected together, the installation comprising:
a plurality of cutting plates; the plurality of cutting plates comprising:
a planar interface configured to accept electrical connectors intended to connect together electrical cables of the harnesses to make electrical connections, the interface being defined in a plane having a first direction referred to as longitudinal and a second direction referred to as vertical which is orthogonal to the first direction, the vertical direction corresponding to the direction in which electrical connectors can be fixed to the interface, which electrical connectors are set out parallel to one another in succession in the said longitudinal direction;
first and second ramps arranged one on either side of the interface, parallel to the longitudinal direction, and configured to act as supports for the harnesses; and
first and second lateral walls provided at the ends of the interface with respect to the longitudinal direction; and
fixing-aid elements,
wherein the dimensions of the interface and of the first and second ramps in the longitudinal direction are adapted to suit the number of connectors that the cutting plate is to be able to accept;
the dimensions of the interface and of the ramps in the directions other than the said longitudinal direction and the dimensions of the lateral walls of the cutting plate conform to standard dimensions; and
the fixing-aid elements are provided on at least two different faces of the cutting plate;
wherein the plurality of the cutting plates have different dimensions in the longitudinal direction and the same dimensions and shapes in the other directions.

15. An aircraft comprising at least one electrical installation; the at least one electrical installation comprising:
wiring harnesses of electrical cables and cutting plates which are provided with electrical connectors and allow at least two wiring harnesses of electrical cables to be connected together,
the installation comprising:
a plurality of cutting plates; the plurality of cutting plates comprising:

a planar interface configured to accept electrical connectors intended to connect together electrical cables of the harnesses to make electrical connections, the interface being defined in a plane having a first direction referred to as longitudinal and a second direction referred to as vertical which is orthogonal to the first direction, the vertical direction corresponding to the direction in which electrical connectors can be fixed to the interface, which electrical connectors are set out parallel to one another in succession in the said longitudinal direction;

first and second ramps arranged one on either side of the interface, parallel to the longitudinal direction, and configured to act as supports for the harnesses; and first and second lateral walls provided at the ends of the interface with respect to the longitudinal direction; and fixing-aid elements, wherein the dimensions of the interface and of the first and second ramps in the longitudinal direction are adapted to suit the number of connectors that the cutting plate is to be able to accept;

the dimensions of the interface and of the ramps in the directions other than the said longitudinal direction and the dimensions of the lateral walls of the cutting plate conform to standard dimensions; and the fixing-aid elements are provided on at least two different faces of the cutting plate;

wherein the plurality of the cutting plates have different dimensions in the longitudinal direction and the same dimensions and shapes in the other directions.

* * * * *